United States Patent [19]

Tsukakoshi et al.

[11] Patent Number: 4,546,369
[45] Date of Patent: Oct. 8, 1985

[54] LIGHT-ACTIVATED AMPLIFIED GATE BI-DIRECTIONAL THYRISTOR

[75] Inventors: Tsuneo Tsukakoshi, Zushi; Hiromichi Ohashi, Yokohama, both of Japan

[73] Assignee: Tokyo Shibaura Denki Kabushiki Kaisha, Kawasaki, Japan

[21] Appl. No.: 545,237

[22] Filed: Oct. 25, 1983

[30] Foreign Application Priority Data

Nov. 24, 1982 [JP] Japan .................. 57-205661

[51] Int. Cl.$^4$ .......................... H01L 29/747
[52] U.S. Cl. ........................ 357/39; 357/20; 357/30; 357/55; 357/86
[58] Field of Search .............. 357/20, 39, 30, 55, 357/86

[56] References Cited

U.S. PATENT DOCUMENTS

| | | | |
|---|---|---|---|
| 4,142,201 | 2/1979 | Sittig et al. | 357/30 |
| 4,216,487 | 8/1980 | Konishi et al. | 357/55 |
| 4,286,279 | 8/1981 | Hutson | 357/86 |
| 4,396,932 | 8/1983 | Alonas et al. | 357/39 |
| 4,430,663 | 2/1984 | D'Altroy et al. | 357/39 |

FOREIGN PATENT DOCUMENTS 56-28029 6/1981 Japan .................. 357/39

Primary Examiner—Joseph E. Clawson, Jr.
Attorney, Agent, or Firm—Oblon, Fisher, Spivak, McClelland & Maier

[57] ABSTRACT

A light-activated bi-directional thyristor of a planar structure having P type base layers for first and second thyristors in a light receiving section, the P type base layers being separated from each other by an N type base layer. An N type emitter layer is formed at that part of the P type base layer for the second thyristor which is located on the side of the light receiving section. A first auxiliary electrode is laminated to the N type emitter layer to form an amplifying gate section. A second auxiliary electrode is formed on the P type base layer which is located opposite the light receiving section. On-current of the amplifying gate section is supplied to a shorted emitter in the second thyristor, through a connector for electrically connecting the first and second auxiliary electrodes.

10 Claims, 2 Drawing Figures

LIGHT-ACTIVATED AMPLIFIED GATE BI-DIRECTIONAL THYRISTOR

BACKGROUND OF THE INVENTION

The present invention relates to a light-activated bi-directional thyristor which is switched in response to a light signal.

Generally, a bi-directional thyristor comprises a first thyristor region, in which semiconductor layers of different conductivity types are successively arranged in an order denoted as NPNP, from one face to the other of a semiconductor substrate; and a second thyristor region, in which the semiconductor layers are arranged in an order denoted as PNPN. Of the paired main electrodes in this bi-directional thyristor, the one on the main face of the semiconductor substrate serves as a cathode electrode for the first thyristor region and as an anode electrode for the second thyristor region, as well; while the other which is on the other main face of said semiconductor substrate, serves as an anode electrode for the first thyristor region and, also, as a cathode electrode for the second thyristor region. When a trigger signal is applied to the gate under conditions wherein a voltage of a given polarity is being applied between these main electrodes, one of the thyristor regions is rendered conductive.

Light-activated bi-directional thyristors to which light is applied as a gate trigger signal have long been well known. Such bi-directional thyristors have two areas in which carriers activated by light are found. One of them is a first central junction, reversely biased, in the first thyristor region; and the other is a second central junction, reversely biased, in the second thyristor region. These first and second junctions are located at different depths, when measured from the surface of each of the thyristor regions upon which light is incident. Therefore, light-activated bi-directional thyristors have a drawback, in that the sensitivity of light activation is different at the two thyristor regions.

A light-activated bi-directional thyristor which has overcome the above-mentioned drawback was disclosed in, e.g., Japanese Patent Publication No. 56-28029. Such a thyristor is so arranged that the central junction in one of the thyristor regions is extended to a point near its light-incident surface, a part of the extended central junction is made parallel to its light-incident surface, the end of the extended central junction is formed apart from its light-incident surface, and the end of said extended junction is exposed a groove whose surface is coated with passivation glass.

In the thyristor arranged as described above, the number of carriers generated is substantially the same at the first and second central junctions. However, the distance between the carrier generating area and the N type emitter layer varies considerably at the first and second central junctions, leaving the sensitivity of light activation as yet unbalanced in the first and second thyristor regions.

SUMMARY OF THE INVENTION

The object of the present invention is to provide a light-activated bi-directional thyristor wherein the sensitivity of light activation is made the same in the two thyristor regions.

This and other objects are achieved by a light-activated bi-directional thyristor, which comprises a first thyristor region having an N type emitter layer, P type base layer, N type base layer, and P type base layer configuration; a second thyristor region having an N type emitter layer, P type base layer, N type base layer and P type base layer configuration, the P type base layer in the second thyristor region being integrally formed with the P type emitter layer in the first thyristor region, the N type base layer in the second thyristor region being integrally formed with the N type base layer in the first thyristor region, and the P type emitter layer in the second thyristor region being integrally formed with the P type base layer in the first thyristor region, and a PN junction formed by the P and N type base layers in the second thyristor region and a PN junction formed by the N type base layer and the P type emitter layer in the second thyristor region being exposed on one of the main faces of a semiconductor layer; a part of each of the P type base layers in the first and second thyristor regions separated on a light receiving section by the N type base layer in the first and second thyristor regions, so as to be activated by a light signal applied from the outside; an amplifying gate section formed at a part of the P type base layer in the second thyristor region, which region is located on the side of the light receiving section, and comprising an N type emitter layer formed in the P type base layer and a first auxiliary electrode bridging the N type emitter layer and the P type base layer to constitute a shorted emitter structure; a second auxiliary electrode insulatingly formed at a part of the P type base layer in the second thyristor region located opposite the light receiving section; and a connecting means for electrically connecting the first and second auxiliary electrodes.

When constructed as described above, the light-activated bi-directional thyristor can correct that unbalance in the sensitivity of light activation which might be caused by the difference in the distance between the carrier occurring area and the N type emitter layer in each of the two thyristor regions.

BRIEF DESCRIPTION OF THE DRAWINGS

Other objects and advantages of the present invention may be seen from the following detailed description, with reference to the accompanying drawings, in which.

DETAILED DESCRIPTION OF THE PREFERRED EMBODIMENTS

Figure 1:
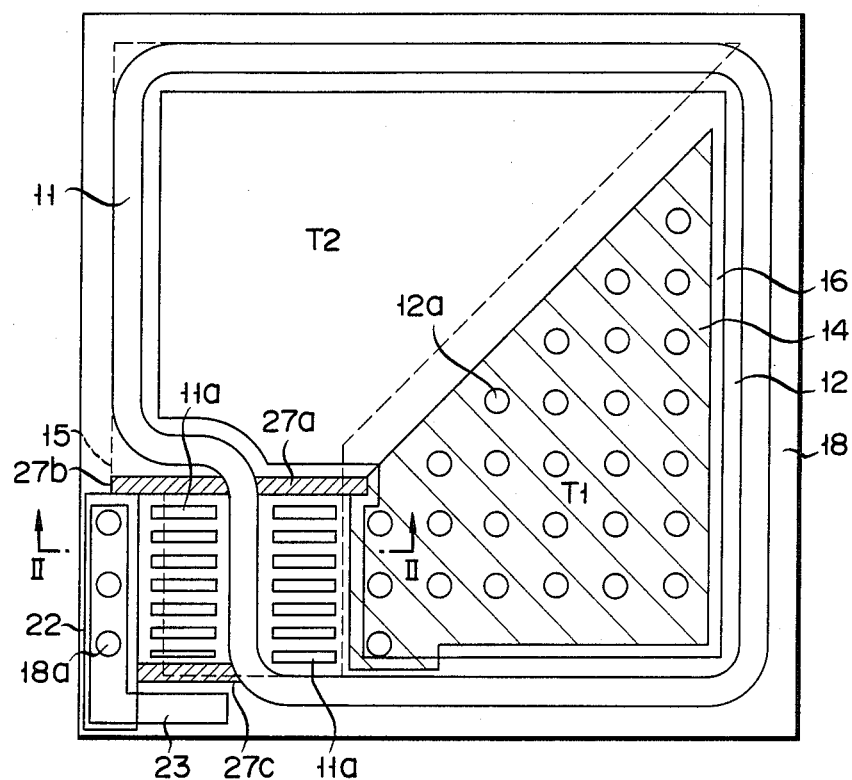
FIG. 1 is a plan view showing an embodiment of a light-activated bi-directional thyristor according to the present invention.

An embodiment of a light-activated bi-directional thyristor according to the present invention may now be described with reference to FIGS. 1 and 2.

Such a thyristor is formed as follows. A P type impurity or boron, for example, is selectively diffused at a depth greater than 100 $\mu$m at both sides of an N type substrate (or N type layer 11), which is 200 $\mu$m thick. Therefore, a P type layer 18 which becomes an isolation region is formed. Boron and P type impurity, is then diffused at a depth of 30 $\mu$m, to form P type layers 12, 13 and 19. The terrace portion of the P type layer 19 at the light receiving area 20 is now connected to the P type layer 13 opposite the light receiving area 20, by means of P type layer 18. The N type layer 11 enclosed by P type layers 12 and 19 is exposed on the circumference of a thyristor pellet. This N type layer 11 is formed in such a way that boron is selectively diffused, using an oxidized film as a mask. As may be seen from FIG. 1, stripe-like N type layers 11a are exposed on the surface of a part of the terrace portion of P type layers 12 and 19. This helps to enhance the sensitivity of light activation. These stripe shaped N type layers 11a can be formed at the same time that P type layers 12 and 19 are formed, by selective diffusion of boron using an oxidized film as a mask.

Using an oxidized film as a mask, an impurity such as phosphorus, for example, is selectively diffused to form N type layers 14 and 15, which serve as N type emitter regions for thyristors $T_1$ and $T_2$, and to form an N type layer 22 at a part of P type layer 19, each of said N type layers 14, 15, 22 having a depth of about 15 $\mu$m. N type layer 22 serves as an auxiliary emitter region. These emitter regions are designed to have the so-called shorted emitter structures 12a, 13a, 18a. Grooves 27a, 27b and 27c, which are obliquely lined and which serve as guards for reducing the leakage of photo-current and guiding photocurrent in a certain direction, are formed at a depth of about 20 $\mu$m by chemical etching. A glass passivation film is formed on junctions $J_3$ and $J_4$, which are exposed on the thyristor regions. First main and an auxiliary electrodes 16, 23 are individually formed by a vapored film, such as V-Ni-Au, on one main surface, from which the light receiving area 20 is excluded. Second main and auxiliary electrodes 17, 24 are also individually formed in the same manner, on the other main surface. The first and second auxiliary electrodes 23, 24 are electrically connected to each other by external wiring 26, using ultrasonic bonding, for example, and the surface of the second auxiliary electrode 24 is electrically insulated by an insulator layer 25.

The operation of this thyristor may be described as follows. In the case of radiating a light signal 21 to the light receiving section 20 at the time when the central junction $J_3$ of the first thyristor $T_1$ is reversely biased, a photocurrent $Iph_1$ occurs near the reversely-biased junction $J_3$. A large amount of photo-current also occurs, simultaneously, at the exposed portion of the N type layer 11 which is in the light receiving area 20. This photocurrent $Iph_1$ flows across the P type layer 12 to the first main electrode 16, through the shorted emitter portion 12a which is formed in the first thyristor $T_1$. At this time, the photo-current $Iph_1$ effectively flows to the shorted emitter portion 12a, due to the groove 27a shown in FIG. 1. A junction $J_1$ between the N type layer 14 and P type layer 12 in the first thyristor $T_1$ is forward-biased, due to a traverse voltage drop caused in the P type layer 12. When this forward-biased voltage Vp approaches the built-in potential of the junction $J_1$, the entry of electrons from the N type layer 14 to the P type layer 12 increases, to activate the first thyristor $T_1$. This operation will hereinafter be referred to as the I+ mode.

In the case of radiating a light signal 21 onto the light receiving area 20, at the time when the central junction $J_4$ is reversely biased in the second thyristor region $T_2$, a photocurrent $Iph_2$ occurs near the junction $J_4$ formed between the P type layer 19 and the N type layer 11. A large amount of photocurrent also occurs, at the same time, at the exposed portion of the N type layer 11 which is formed on the surface of the light receiving section 20. This photocurrent $Iph_2$ flows across the P type layer 19 to the first auxiliary electrode 23, through the shorted emitter portion 18a of the N type layer 22, at the light receiving section 20. At this time, the photo- current $Iph_2$ flows effectively to the shorted emitter portion 18a, due to the grooves 27b, 27c. The junction between the N type layer 22 and the P type layer 19 is forward-biased, due to a traverse voltage drop occurring in the P type layer 19. The auxiliary thyristor formed in an N type layer 22 - P type layer 19 - N type layer 11 - P type layer 12 configuration is thus activated. The on-current flows through the first auxiliary electrode 23, to the second main electrode 17 through the wiring 26 which serves as an electric connector arranged externally of the thyristor, and through the second auxiliary electrode 24 arranged opposite the light receiving section 20. A junction $J_2$ between the N type layer 15 and the P type layer 13 in the second thyristor $T_2$ is forward-biased at this time, due to a traverse voltage drop occurring in the P type layer 13. When this forward-biased voltage Vp approaches the built-in potential of the junction $J_2$, the entry of electrons from the N type layer 15 to the P type layer 13 increases quickly, to activate the second thyristor $T_2$. This operation will hereinafter be referred to as the III+ mode.

In the case of conventional thyristors, the distance between the carrier occurring area and the N type emitter layer in the first thyristor region $T_1$ is different from that between the carrier occurring area and the N type emitter layer in the second thyristor region $T_2$, thus leaving the sensitivity of light activation as yet unbalanced in the first and second thyristor regions $T_1$, $T_2$. In the case of the thyristor according to the present invention, however, since the light sensitivity of the second thyristor region $T_2$ is determined by the amplifying gate section formed in the P type layer 19 and quantum efficiencies under the I+ and III+ modes can thus be made equal to each other. Therefore, the imbalance in the sensitivity of light activation can be corrected in the two thyristor regions $T_1$, $T_2$.

Figure 2:
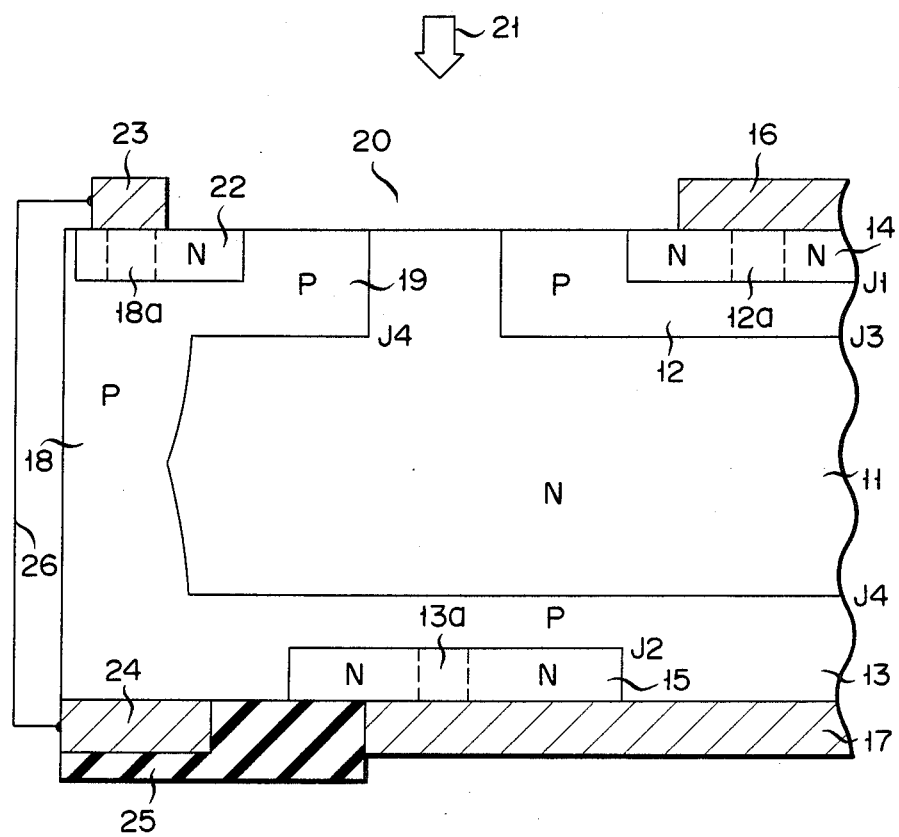
FIG. 2 is a sectional view taken along line II—II of FIG. 1.

When the amplifying gate section is formed according to the present invention, in addition to the fact that the P type layers 12, 19 in the light receiving section 20 are made the same in depth and area, and the remaining geometric shape of the light receiving section 20 is made the same, as shown in FIGS. 1 and 2, the effect achieved is further intensified.

When the guard 27a, 27b, 27c for preventing a photocurrent from leaking at the circumference of the light receiving section and for guiding a photocurrent in a given direction are formed, as shown in FIG. 1, carriers can be effectively used for light activation.

When each of N type emitter layers 14, 15 is formed in such a way as to have the shorted emitter structure shown in FIGS. 1 and 2, a thyristor can be provided which has high dv/dt capability and sensitivity of light activation which is the same in the two thyristor regions $T_1$, $T_2$.

When the stripe shaped N type layers are exposed on the surfaces of those P type base layers in the first and second thyristor regions which are present on the side of the light receiving section, as shown in FIG. 1, light receiving sensitivity can be increased.

The effects achieved by the embodiment of the present invention are assessed in terms of numerical values. The minimal trigger power needed by the conventionally-constructed thyristor can be reduced to $\frac{2}{3}$ its initial value, or more. Withstanding voltage is 600 V; current carrying capacity, 16A; and the required dv/dt 200 V/$\mu$sec. The thyristor can be triggered in response to the extremely poor light of a small LED with an output of 10 mW.

Although the wiring 26 for electrically connecting the auxiliary electrodes 23, 24 is formed by the bonding wire in the above-described embodiment, it may be formed by plating, conductive paste, etc.

According to the present invention, a light-activated bi-directional thyristor with excellent switching characteristic and high withstanding voltage can be provided, wherein light trigger powers can be made equal under the I+ and III+ modes, and wherein light activation in the bi-direction can be attained by the application of a minimal trigger power source of several mW.

What is claimed is:

1. A light-activated bi-directional thyristor of a planar structure, comprising:

a first thyristor having an N type emitter layer, a P type base layer, an N type base layer and a P type emitter layer;

a second thyristor having an N type emitter layer, a P type base layer, an N type base layer and a P type emitter layer, the P type base layer in the second thyristor being formed integral with the P type emitter layer in the first thyristor, the N type base layer in the second thyristor being formed integral with the N type base layer in the first thyristor, the P type emitter layer in the second thyristor being formed integral with the P type base layer in the first thyristor, PN junctions formed by the P and N type base layers in the second thyristors and by the N type base layer and the P type emitter layer in the second thyristor being exposed on one of the main surfaces of a semiconductor layer, and parts of the P type base layers in the first and second thyristors being formed on the side of a light receiving section and being separated by the N type base layer in the first and second thyristors, so as to cause the first and second thyristors to be activated in response to a light signal applied from the outside;

an amplifying gate section formed at that part of the P type base layer in the second thyristor which is located on the side of the light receiving section, said amplifying gate section comprising an N type emitter layer formed in the P type base layer and a first auxiliary electrode bridging the N type emitter layer and the P type base layer to constitute a shorted emitter structure;

a second auxiliary electrode insulatingly formed at that part of the P type base layer in the second thyristor which is located opposite the light receiving section; and a connecting means for electrically connecting the first and second auxiliary electrodes.

2. A thyristor according to claim 1, wererin grooves are formed on the light receiving section and each of said grooves serves as a guard for reducing the leakage of photocurrent caused by a light signal, and for guiding said photocurrent in a predetermined direction.

3. A thyristor according to claim 1, wherein the light receiving section on the side of which the first thyristor is located is substantially the same in shape as a light receiving section on the side of which the second thyristor is located.

4. A thyristor according to claim 3, wherein the P type base layer in the first thyristor is equal in depth to the P type base layer in the second thyristor which is located on the side of the light receiving section, and PN junctions formed by said P type base layers and the N type base layers in the light receiving section are substantially the same in area.

5. A thyristor according to claim 1, wherein each of the N type emitter layers in the first and second thyristors is so formed as to have a shorted emitter structure.

6. A thyristor according to claim 1, wherein stripe-shaped N type layers are exposed on the surfaces of those P type base layers of the first and second thyristors which are present on the light receiving section.

7. A light-activated bi-directional thyristor of a planar structure comprising:

a semiconductor substrate of the N type;

a first semiconductor layer of the P type formed in a first main surface of said semiconductor substrate;

a second semiconductor layer of the N type formed in the first semiconductor layer of the P type;

a third semiconductor layer of the P type formed in a second main surface of said semiconductor substrate and extending along the side of said semiconductor substrate to the first main surface thereof, a part of said third semiconductor layer which is located on the side of the first main surface having substantially the same depth as that of said first semiconductor layer and extending in the same direction as said first semiconductor layer;

a fourth semiconductor layer of the N type formed in the third semiconductor layer of the P type, which layer is located on the side of the second main surface;

a part of said N type semiconductor substrate being exposed on the first main surface, so that a PN junction formed by the first semiconductor layer of the P type and the semiconductor substrate of the N type, and a PN junction formed by the third semiconductor layer of the P type and the semiconductor substrate of the N type, are exposed on the first main surface;

a light receiving section consisting of the third semiconductor layer which is present in the first main surface, the exposed portion of said N type semiconductor substrate, and said first semiconductor layer of the P type, said light receiving section serving to activate the thyristor;

a first electrode formed over the first and second semiconductor layers, from which the light receiving section is excluded;

a second electrode formed over the third and fourth semiconductor layers on the second main surface;

a first thyristor consisting of the first, second and third semiconductor layers, and the semiconductor substrate;

a second thyristor consisting of the first, third and fourth semiconductor layers and the semiconductor substrate;

an amplifying gate section formed at that part of said third semiconductor layer which is located on the side of the first main surface, and comprising a fifth semiconductor layer of the N type, formed in the third semiconductor layer, and a first auxiliary electrode bridging the fifth semiconductor layer of the N type and the third semiconductor layer;

a second auxiliary electrode insulatingly formed at that part of the third semiconductor layer which is located on the side of the second main surface; and a connecting means for electrically connecting the first and second auxiliary electrodes.

8. A thyristor according to claim 7, wherein said light receiving section is provided with grooves, each of which serves as a guard for reducing the leakage of the photocurrent generated by incoming light, and guiding said photocurrent in a predetermined direction.

9. A light-activated bi-directional thyristor of a planar structure comprising:
- a semiconductor substrate;
- a first PN junction consisting of first N and P type layers, which layers are formed in the semiconductor substrate;
- a second PN junction consisting of the first P type layer and a second N type layer, which layers are formed in the semiconductor substrate;
- a third PN junction consisting of the second N type layer and a second P type layer, which layers are formed in the semiconductor substrate, the first to third PN junctions being exposed on a first main surface of said semiconductor substrate, light being applied to parts of the second and third PN junctions where carriers are generated to activate the thyristor, and those parts of said second and third PN junctions being formed parallel to the first main surface of the semiconductor substrate and being of substantially the same depth, so as to make their light receiving sensitivities the same;
- a fourth PN junction consisting of the second P type layer and a third N type layer, which layers are formed in the semiconductor substrate, said fourth PN junction being exposed on a second main surface of said semiconductor substrate;
- a first electrode formed over the first N and P type layers, those parts of these layers to which light is applied being excluded;
- a second electrode formed over the second P type layer and the third N type layer on the second main surface;
- a first thyristor consisting of the first to third PN junctions;
- a second thyristor consisting of the second to fourth PN junctions;
- an amplifying gate section formed at that part of the second P type layer which is present on the first main surface, said amplifying gate section comprising a fourth N type layer formed in the second P type layer, and a first auxiliary electrode bridging the fourth N type layer and the second P type layer;
- a second auxiliary electrode insulatingly formed at that part of the third semiconductor area which is located on the side of the second main surface; and
- a connecting means for electrically connecting the first and second auxiliary electrodes.

10. A thyristor according to claim 9, wherein the first main surface to which light is applied is provided with grooves, each of which serves as a guard for reducing the leakage of the photocurrent generated by a light signal and guiding said photocurrent in a predetermined direction.

* * * * *